United States Patent
Kondo et al.

(10) Patent No.: US 6,489,027 B1
(45) Date of Patent: Dec. 3, 2002

(54) HIGH PURITY CARBON FIBER REINFORCED CARBON COMPOSITES AND MANUFACTURING APPARATUS FOR USE THEREOF

(75) Inventors: Teruhisa Kondo, Osaka (JP); Toshiaki Sogabe, Kagawa (JP); Toshiharu Hiraoka, Kagawa (JP); Masatoshi Yamaji, Kagawa (JP); Naoto Ohta, Kagawa (JP)

(73) Assignee: Toyo Tanso Co., Ltd., Osaka (JP)

( * ) Notice: Subject to any disclaimer, the term of this patent is extended or adjusted under 35 U.S.C. 154(b) by 0 days.

(21) Appl. No.: 09/457,745

(22) Filed: Dec. 10, 1999

(30) Foreign Application Priority Data

Feb. 24, 1999 (JP) ............................................. 11-046286

(51) Int. Cl.⁷ ............................................... B32B 9/00

(52) U.S. Cl. .................... 428/408; 442/179; 423/447.1; 264/46.4; 117/13

(58) Field of Search ............................. 428/408, 293.4; 423/447.1; 442/179; 117/13, 14, 200; 264/46.4

(56) References Cited

U.S. PATENT DOCUMENTS

| | | | |
|---|---|---|---|
| 5,616,175 A | 4/1997 | Walsh | 117/14 |
| 5,683,281 A | 11/1997 | Metter | 442/179 |
| 5,800,924 A | 9/1998 | Metter | 428/408 |

FOREIGN PATENT DOCUMENTS

WO    WO 91/04954    4/1991

*Primary Examiner*—Deborah Jones
*Assistant Examiner*—Abraham Bahta
(74) *Attorney, Agent, or Firm*—Oblon, Spivak, McClelland, Maier & Neustadt, P.C.

(57) ABSTRACT

A high-purity carbon fiber reinforced carbon composite formed by a process which entails graphitizing a molded member packed with carbon fibers, which fibers are subjected to a purification process under halogen gas prior to being graphitized and prior to being packed with a matrix of carbon material, and the matrix of carbon material, the carbon fiber reinforced carbon composite having an impurities content of not more than 30 ppm in ash content and satisfies either or both of the following conditions for impurities:

(1) V is not more than 0.12 ppm by ICP-OES; and
(2) Fe is not more than 0.10 ppm by ICP-OES.

20 Claims, 2 Drawing Sheets

HIGH PURITY CARBON FIBER REINFORCED CARBON COMPOSITES AND MANUFACTURING APPARATUS FOR USE THEREOF

BACKGROUND OF THE INVENTION

1. Field of the Invention

The present invention relates to high purity carbon fiber reinforced carbon composites (hereinafter referred to as C/C composites) having a reduced impurities content by using a high purity treatment. More particularly, the present invention relates to high-purity C/C composites useful as semiconductor material processing components, such as Czochralski (hereinafter referred to as CZ) furnace components and apparatus.

2. Description of the Background

FIG. 2 illustrates a pulling single crystal apparatus used in the CZ process for manufacturing a single crystal ingot for use as a material of a semiconductor wafer, for example. As shown in FIG. 2, the CZ apparatus is so structured that a raw material in a quartz crucible 1 is heated to a high temperature by a heater 2 disposed around the quartz crucible 1 so that the raw material can be converted into the melt 3 which is pulled under vacuum pressure to form the single crystal ingot 4.

The structural elements, such as a crucible 5 supporting the quartz crucible 1 and an upper ring 6, an inner shield 7 and others which are subjected to radiant heat of the heater 2, are exposed to high temperature when pulling a single crystal ingot 4 from the quartz crucible 1 within a molten silicon.

Accordingly, the structural elements must be formed of a material that can maintain a prescribed mechanical strength under high temperature. Further, the structural elements must be formed of a material of high-purity, because impurities, such as metals, contained in the structural elements lead to crystal defects in orientation of the solidifying single crystal ingot 4 and also lead to reduced purity, when leaked during manufacturing. In general, a high purity graphite having excellent mechanical properties at high temperature and having high-purity is used for the structural elements of the CZ apparatus (Japanese Patent Publication No. Hei 6(1994)-35325). Recently, with increasing diameter of the single crystal, the single crystal pulling apparatus used in the CZ process has also been increased in size. This leads to difficult handling because of the increased weight of the graphite elements and a problem in reducing the effective processing size of the interior of the apparatus.

The C/C composites have the properties of lightweight and excellent mechanical strength, as compared with the graphite material. Thus, even when reducing thickness, the structural elements of the C/C composites exhibit a strength equal to that of the graphite material, allowing effective use of the processing chamber of the apparatus. In addition, by being lightweight, the apparatus may be easily handled. With such advantages, crucible components used in the CZ apparatus having a large diameter are now moving from those made of graphite to those made of C/C composites.

Recently, elements for use in a CZ apparatus made of high purity C/C composites have been proposed. For example, U.S. Pat. Nos. 5,683,281 and 5,800,924 disclose high purity C/C composites subjected to degasification at 2,400° C. to 3,000° C. under an inert gas atmosphere in the carbon fiber stage; impregnation with high purity pitch or resin for densification; graphitization; and high purification at 2,400° C. to 3,000° C. under a halogen gas atmosphere, so that the impurities of Ag, Al, Ba, Be, Ca, Cd, Co, Cr, Cu, K, Mg, Mn, Mo, Na, Ni, P, Pb, Sr and Zn can be reduced below the detection limit by inductively coupled plasma spectroscopy (ICP). U.S. Pat. No. 5,616,175 discloses 3-D C/C composites for a pulling single crystal apparatus which is impregnated with the carbon material which results in a matrix which is then graphitized, followed by high purification under a halogen gas, so that the impurities are not more than 10 ppm and whose surface is coated with pyrolytic carbon or silicon carbide, for preventing reaction with the gas generated from the melt when the single crystal is pulled.

In the single crystal solidification of the pulling silicon single crystal in the CZ process, well known impurities, such as V and Fe, cause crystal defects in orientation of the solidifying of the single crystal. Therefore, the total content of impurities must be reduced, particularly by decreasing the V and Fe impurities for using the CZ process. In U.S. Pat. Nos. 5,683,281 and 5,800,924, the impurities of V and Fe were detected by ICP. The amounts of the impurities of V and Fe are still too great to control the crystal defects in orientation of the solidifying single crystal.

SUMMARY OF THE INVENTION

It is an object of the present invention to provide high purity C/C composites with reduced impurities content, such as V and Fe, by high purity treatment.

The high purity C/C composites are formed by graphitizing a molded member packed with carbon fibers and carbon material of a matrix. The carbon fibers are highly purified under halogen gas atmosphere. The purified carbon fibers are molded into the desired shape on a tool or in a die and impregnating the carbon material of the matrix. The molded member packed with carbon fibers and carbon material of the matrix are either independently or simultaneously graphitized with high-purification under halogen gas atmosphere, and then are highly purified under a vacuum/halogen gas atmosphere in order to highly purify the C/C composites. According to the present process, impurities are greatly reduced. The impurities content of V and Fe, for example, are not more than 0.12 ppm and 0.10 ppm by ICP optical emission analysis, respectively.

The carbon material of the matrix impregnated carbon fibers become graphite fibers. The carbon material of the matrix around the graphite fibers also becomes graphite and coats the graphite fibers. The present high-purity C/C composites contain two graphites namely, the high-purity graphite fibers and the high-purity graphite matrix. According to the structure of the C/C composites, the impurities may be difficult to dissolve from the inside of the graphite fibers.

The C/C composites of U.S. Pat. Nos. 5,683,281, 5,800,924 and 5,616,175 are highly-purified under halogen gas at one time after graphitizing the molded C/C composites which are structured to coat the graphite matrix on the graphite fibers. Accordingly by structure, the C/C composites may be mainly purified around the outside surface of the graphite matrix, and the impurities of the inside of the graphite matrix and of the graphite fibers may be difficult to purify in the purification process thereof. The graphite fibers of the present invention are highly purified because the fibers are purified under halogen gas atmosphere before molding and graphitizing, and then the graphitized and molded C/C composites are either independently or simultaneously graphitized with high-purification under halogen gas atmosphere. The purity of the resulting C/C composites is not more than 30 ppm of ash content.

DETAILED DESCRIPTION OF THE INVENTION

Figure 1:
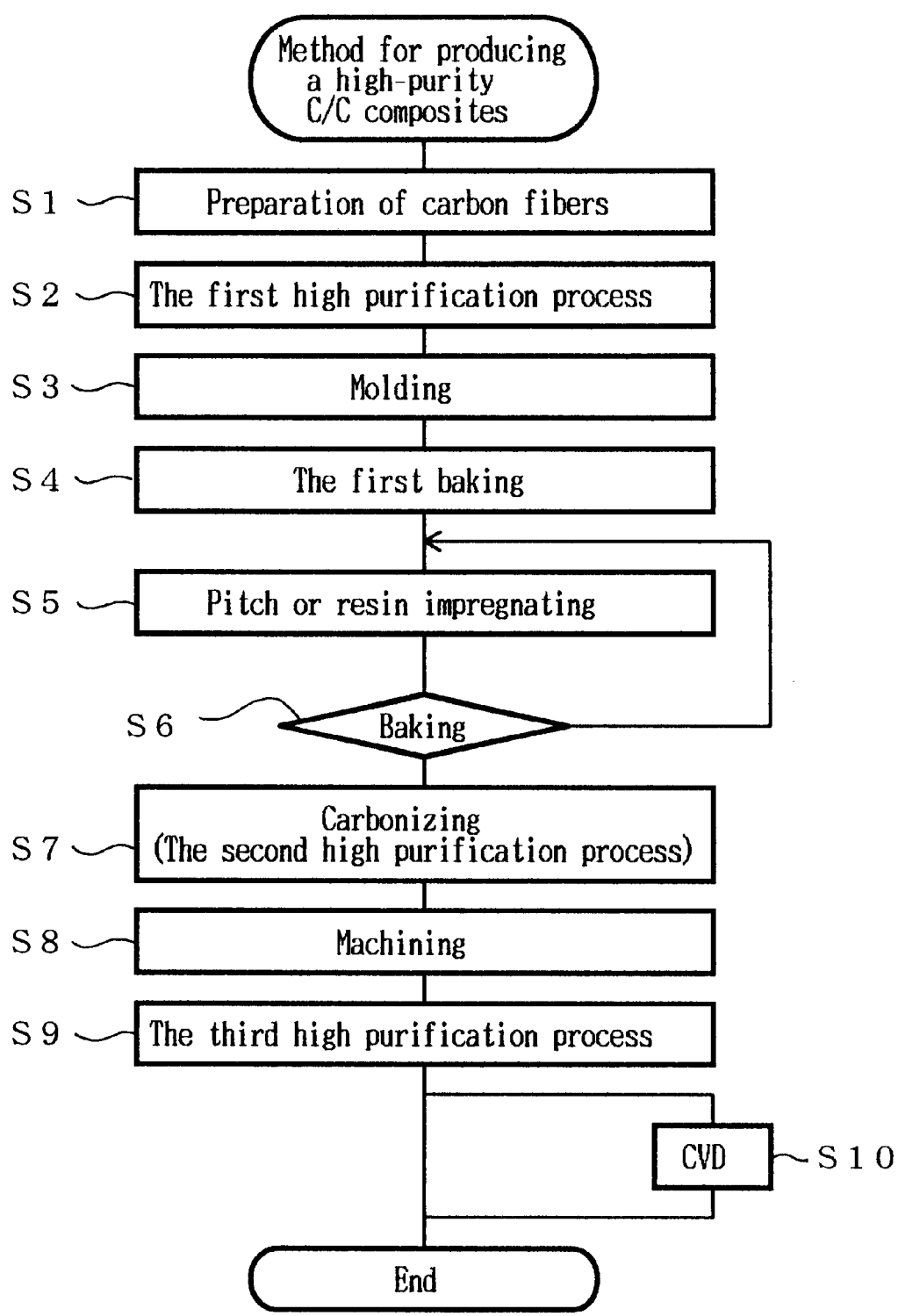
FIG. 1 is a flow chart of the manufacturing the high purity C/C composite.

In the present invention, the graphitized and highly purified C/C composites are further purified under halogen gas at reduced pressure, i.e., vacuum. The process further enhances the purity of the C/C composites.

After the high-purification process under vacuum/halogen gas, pyrolytic carbon is impregnated and coats the C/C composites by chemical vapor deposition (CVD). According to the CVD process, the high-purity pyrolytic carbon densifies in pores of the graphite matrix, and coats the entire surface of the C/C composites. The impurity gas generated from the pyrolytic carbon uncoated inside of the C/C composites can be shielded in the coated pyrolytic carbon. In addition, the C/C composites of the present invention are purified under halogen gas atmosphere at the carbon fiber stage, decreasing the gas generated from the fibers. The C/C composites of the present invention have the properties of conventionally produced C/C composites, yet have an improved purity resulting from the process for a pulling single crystal for semiconductor industry.

The carbon fibers may be used polyacrylonitrile (PAN), rayon or pitch. The impurities content of the carbon fibers may be not more than 80 ppm, because the impurities content of the C/C composites is not more than 30 ppm, and more preferably 10 ppm, and more preferably 5 ppm.

The total ash content is determined by the following method. The sample of 20 g measured precisely and filled in a crucible made of platinum (50 cc capacity) was heated at 950° C. in an oxygen stream (2 to 3 l/min) until it reached a constant weight and then was spontaneously cooled in a desiccator, and then the remaining ash content was measured.

The impurities content is determined by inductively coupled plasma spectroscopy (ICP). There are two types of ICP. One is ICP optical emission spectroscopy (ICP-OES); the other one is ICP mass spectroscopy (ICP-MS). In the present invention, the determination of the impurities of the C/C composites conducted with ICP-OES. In ICP-OES, injecting and dissolving the elements to the inductively coupled plasma ionizes elements of the metals. The impurities elements of the specimen are detected by an intensity difference of the optical waves from the ionized elements. The dissolving acid for the elements in the specimen may be sodium bicarbonate, hydrochloric acid, pyrosulfuric potassium, hydrogen fluoride, or boric acid or a combination thereof may be used within which its property is not impaired because of the elements in the specimen are different from the dissolving acid.

The detection limit of the elements is calculated from 3 times standard deviation of background noise level of the individual elements.

Impregnating the carbon material containing pitch, phenol and pyrolytic carbon into a molded member formed of the carbon fibers forms the matrix available for densification. The pyrolytic carbon used herein is intended to include high purity carbonaceous material or graphite material obtained by pyrolyzing hydrocarbons including hydrocarbon gases of 1 to 8 carbons, particularly 3 carbons, such as propane and methane gas.

Figure 2:
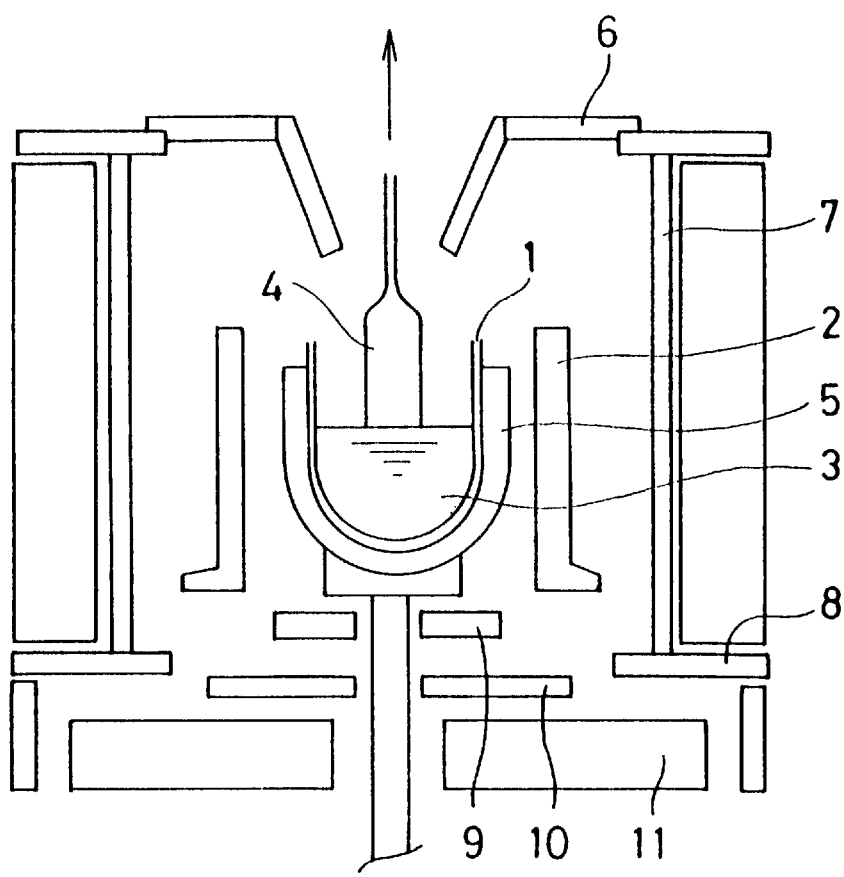
FIG. 2 is a schematic cross sectional views of the CZ apparatus.

The C/C composite has a density of 1.35 to 1.80 g/cm$^3$ and a fiber content of 45 to 60%, a bending strength of 55 to 200 MPa and an electrical resistively at room temperature of 13 to 40 $\mu\Omega \cdot$m. According to these properties, the C/C composites can be used for the structural elements of the CZ apparatus as shown in FIG. 2. The crucible 5 supporting the quartz crucible may have a density of 1.50 to 1.60 g/cm$^3$, more preferably 1.53 to 1.57 g/cm$^3$ and a bending strength of 180 to 200 MPa, more preferably 190 to 200 MPa because of handling for setting in the CZ apparatus. The crucible 5 is easy to react with silicon oxygen gas from molten silicon and/or the quartz crucible, due to contacting to the quartz crucible directly. However, the density is controlled to be in the range of 1.50 to 1.60 g/cm$^3$, the silicon oxygen gas is diffused inside of the C/C composites to be protected and silicon carbonization of the C/C composites is suppressed. As shown in FIG. 2, an inner shield 7 and others are objected to keep temperature distribution in the CZ apparatus, but they must be have prescribed mechanical properties due to the increased in size of the CZ apparatus. Further, they must have a density of 1.37 to 1.53 g/cm$^3$, more preferably 1.39 to 1.49 g/cm$^3$. The lower heater 9 may have a high electrical resistively of 17 to 22 $\mu\Omega \cdot$m, more preferably 18 to 20 $\mu\Omega \cdot$m. Temperature of graphitization and amounts of the impregnated carbon matrix can control the properties of the high purity C/C composites of the present invention. The high purity C/C composites of the present invention can be applied to a first wall and divertor tile of a fusion reactor and used in the aerospace industry.

The manufacturing process of the high C/C composites of the present invention is entails molding carbon fibers, a first high purification process of the carbon fibers, a densification, a baking and a carbonization, a second high purification process with graphitization, and a third high purification process under a vacuum pressure of halogen gas. Conventionally, after these processes, the C/C composites may be shipped to market. The products may be coated with pyrolytic carbon by CVD after the above processes. Each process is described according to FIG. 1 below.

As shown in FIG. 1, the PAN-base or pitch-base carbon fibers are prepared first (S1). Then, the carbon fibers are subjected to high purification at 1,800° C. to 2,200° C. under a halogen gas atmosphere (first high purification process) (S2). The halogen gas used includes halogen or gas of a compound thereof. The halogen gases which may be used include chlorine, chlorine compounds, fluorine and fluorine compounds, together with compounds including chlorine and fluorine in the same molecule, such as monochlorotrifluoromethane, trichloromonofluoromethane, dichlorofluoroethane, trichloromono-fluoroethane and the like. Then, the carbon fibers are allowed to react with these halogen gases, where by the impurities included in carbon fibers are evaporated and volatilized as halide and removed from the carbon fibers. Thereafter, the carbon fibers are allowed to stand in the same processing furnace for a prescribed time under a halogen gas atmosphere, hydrogen gas is fed to a reaction vessel so that the impurities, such as sulfur, can be deposited as hydride and thereby be removed. This can achieve the total ash content of the carbon fibers of not more than 100 ppm, preferably not more than 80 ppm, in the ash content determined method.

After the impurities in the carbon fibers are removed by the high purification process, the carbon fibers are molded (S3) and baked for carbonization on depending carbon fibers (S4). And then the molded member is impregnated with the pitch or resin for densification (S5), and baked at 800° C. to 1,200° C., and thereby these carbon fibers which form the matrix are carbonized (S6). The densification step (S5) and the carbonizing step (S6) are repeated 2 to 4 times.

It is noted that although no particular limitation is imposed on the resin used, as long as it is one which converts to solid phase carbon, such as one resin selected from phenol (resole, novolak), furan, polyimide, polyamide-imide, polyether imide, polycarbodiimide or bisallyldiimide, or a combination thereof may be used within the range within which its property is not impaired. Solvent may be used in combination, when necessary.

For the purpose of high purification and graphitization, the molded member subjected to densification is subjected to high purification and graphitization under a halogen gas atmosphere at temperature (1,800° C. to 2,400° C.) equal to or higher than the first purification process temperature by 100° C. to 200° C. for 5 to 50 hours (second high purification)(S7). This can achieve the total ash content of the molded member of not more than 50 ppm in the ash content determined method.

The second high-purified member is machined and formed into a specified form (S8). The machined member is subjected to high purification under a vacuum pressure of halogen gas (third high purification)(S9). And then the third purified member is subjected to more densification and protecting gas from inside of the member with impregnating and coating of pyrolytic carbon by CVD (S10) on specification of the products.

The condition of the third high purification is under a halogen gas atmosphere in total gas pressure of 13.3 to 55 kPa at 1,800 to 2,200° C. for 5 to 30 hours. According to this process, the impurities are easy to evaporate from inside of the member, so that the purity level is higher than first and second purified member is. The third high-purified member is followed by heat treating under a vacuum pressure in same furnace for removing inside remains gas of the member. This can achieve the total ash content of the molded member of not more than 30 ppm, preferably not more than 10 ppm, in the ash content determined method.

The CVD (S10) referred to be intended to include Chemical Vapor Impregnation (CVI) for the pyrolytic carbon to permeate and precipitate to the inside from the pores. In the CVD using the hydrocarbons or hydrocarbon compounds, the concentration of the hydrocarbon is controlled to be 3 to 30%, preferably 5 to 15%, and the total pressure is controlled to be less than 13.3 kPa, preferably less than 6.65 kPa. In this controlling process, the hydrocarbon forms a large carbon compound in the vicinity of the surface of the base material by the dehydrogenation, thermal decomposition, polymerization and the like, and the large carbon compound is deposited and precipitated on the base material. Then, the dehydrogenation reaction proceeds further, so that a dense pyrolytic carbon layer is formed on the base material or the carbon compound is permeated to be impregnated into the substrate. While the temperature range for the precipitation is in general so broad as 800° C. to 2,500° C., it is preferable that the processes are performed within a relative low temperature range of 1,300° C. or less, to achieve maximum pyrolytic carbon impregnation. Also, the precipitation time of 50 hours or more, or preferably 100 hours or more, enables the pyrolytic carbon to be formed in every space between the fibers, so that the fibers in the inside of the substrate are also coated with the pyrolytic carbon. This contributes to prevention of the gas generated from the inside of the substrate.

For achieving the enhanced impregnation, the isothermal method, the temperature gradient method, the pressure gradient method and the like may be used. Also the pulse method may be used for achieving the shortened process time and the purification.

The CVD (S10) can control the total ash content of the pyrolytic carbon to 5 to 30 ppm in the ash content determined method, to ensure application to the CZ apparatus components. The CZ apparatus components referred to in this application correspond to all known graphite components used in the CZ apparatus, including the crucible, the heater, the upper ring, the lower ring, the inner shield, the seed chuck and others.

The present invention is described below more specifically by reference to certain examples for purposes of illustration. These examples are intended to be merely illustrative and are not limitative.

EXAMPLE 1

A layer of a plain weave cloth of PAN carbon fibers (T-300 6K, made by TORAY INDUSTRIES, INC.) impregnated with phenol resin was laminated on a mandrel, followed by application of the filament windings thereon. The using filaments of the filament windings were heated to 2,000° C. under a halogen gas atmosphere for 25 hours (the first high purification process). In the filaments windings, with six filaments of T-300 12K (Made by TORAY INDUSTRIES, INC.) whose ash content is 76 ppm in the ash content determined method were impregnated with phenol resin, the level winding and the parallel winding of a contact angle of 85° to 90° with respect to the center axis were alternately wound 4 layers each. While the drum is allowed to have 10 layers of the alternate parallel and level windings, the bottom is allowed to have the layers of the level windings only. As a result, a molded member having a layer thickness of 10 mm was obtained. Subsequently, the volatile matter of the obtained molded member was adjusted in an oven at 100° C. and, thereafter, the molded member was solidified by increasing the temperature of the oven up to 200° C. After having been solidified, the molded member was removed from the mandrel to obtain the molded member. Then, the molded member was heated up to 1,000° C. at a heating ratio of 10° C./hr in an electric oven, to obtain the C/C composites. Further, the molded member was subjected to a pitch impregnation process and then was heated up to 1,000° C. at a heating ratio of 10° C./hr in the electric oven with nitrogen flow for baking. The baking process was repeated twice.

Further, as a final heat-treatment, the molded member was heated up to 2,000° C. for 50 hours under 101 kPa of halogen gas atmosphere for the graphitization and the second high purification process. The ash content was 35 ppm. Thereafter, the molded member was machined and formed into a specified form. After the machining process, the member was further high-purified under 55 kPa of halogen gas at 2,200° C. (the third high purification process). And then, for the purpose of being impregnated and coated with pyrolytic carbon, the molded member was set in a vacuum furnace into which methane gas was supplied and kept for 100 hours under the pressure inside the vacuum furnace of 3.3 kPa, followed by being impregnated and coated with the pyrolytic carbon by the CVD process, to thereby produce the end product. The bulk density was 1.60 g/cm$^3$ by the CVD process.

EXAMPLE 2

A plain weave cloth of PAN carbon fibers (T-300 6K, made by TORAY INDUSTRIES, INC.) was cut out in 200 mm×200 mm. The coat plain weave cloth were heated to 2,000° C. under a halogen gas atmosphere for 25 hours (the first high purification process).

The ash content was 76 ppm. The first high purified plain weave cloth laid 50 sheets and was hot pressed at 160° C. under pressure of 3 MPa. Further, the hot pressed 50 layers plain weave cloth was subjected to a pitch impregnation process and then was heated up to 1,000° C. at a heating ratio of 10° C./hr in the electric oven with nitrogen flow for baking. The baking process was repeated 3 times. Further, the molded member was heated up to 2,000° C. for 50 hours under 101 kPa of halogen gas atmosphere for the graphitization and the second high purification process. The ash content was 40 ppm. Thereafter, the molded member was machined and formed into a specified form. After the machining process, the member was further high-purified under 55 kPa of halogen gas at 2,200° C. (the third high purification process) to thereby produce the end product.

EXAMPLE 3

A super yarn plain weave cloth of PAN carbon fibers (W-0202, made by TOHO RAIYON INDUSTRIES, INC.) were heated up to 800° C. for carbonization, and then was cut out in 200 mm×200 mm. The cut plain weave cloth were heated to 2,000° C. under a halogen gas atmosphere for 10 hours (the first high purification process). The ash content was 76 ppm.

The first high purified plain weave cloth laid 50 sheets and was hot pressed at 160° C. under pressure of 3 MPa. Further, the hot pressed 50 layers plain weave cloth was subjected to a pitch impregnation process and then was heated up to 1,000° C. at the heating ratio of 10° C./hr in the electric oven with nitrogen flow for baking. The baking process was repeated 4 times. Further the molded member was heated up to 2,000° C. for 50 hours under 101 kPa of halogen gas atmosphere for the graphitization and the second high purification process. The ash content was 42 ppm. Thereafter, the molded member was machined and formed into a specified form. After the machining process, the member was further high-purified under 55 kPa of halogen gas at 2,200° C. (the third high purification process) to thereby produce the end product.

The tests specimen were cut out to 60×10×3 mm from the C/C composites of Examples 1 to 3, to measure their properties including the fibers content ratio, the bulk density, the bending strength and the electric resistively. Also, their ash content was measured. The fibers content ratio was calculated from the weight and bulk density of the fibers and the bulk density of the products. The bulk density was calculated from the sizes and weights. The bending strength was measured by a three-point bending test with a span of 40 mm. The specific resistance was measured according to JSAS10-1968. The ash content was measured precisely and filled in the platinum crucible having a 50 cc capacity, was heated at 950° C. in the oxygen stream (2–31/min) until it reached the constant weight, as aforementioned. Then, the test example was spontaneously cooled in the desiccator and the remaining ash content was measured. Also, the metal impurities were analyzed by ICP-OES (SPS-4000, made by SEIKO ELECTRIC Co.). The specimen was prepared in 4 types solution for ICP-OES. The first one was dissolved in hydrochloric acid after being dissolved in sodium bicarbonate. The second one was dissolved in hydrochloric acid after being dissolved in pyrosulfuric potassium. The third one was dissolved in nitric acid after being dissolved in hydrogen fluoride. The fourth one was dissolved in hydrochloric acid. The detection limits of the elements were calculated from 3 times standard deviation of background noise level of the individual elements.

The physical properties of the test samples are listed in Table I and results of the ash content and ICP-OES listed in Table II.

As shown in Table II, the high purity C/C composites of the present invention are below the detection limit for ICP-OES for almost metals, and are not more than 5 ppm for the ash content.

TABLE I

|  | Percentage of fiber content, vol % | Bulk density g/cm³ | Bending Strength MPa | Electrical Resistivity μΩ · m |
|---|---|---|---|---|
| Example 1 | 56 | 1.55 | 198 | 14 |
| Example 2 | 49 | 1.64 | 166 | 17.7 |
| Example 3 | 58 | 1.60 | 82.8 | 19.4 |

TABLE II

|  | Detectable limit | Preceding process | Example 1 | Example 2 | Example 3 |
|---|---|---|---|---|---|
| Al | 0.08 | ② | under detectable limit | under detectable limit | under detectable limit |
| B | 0.1 | ④ | under detectable limit | under detectable limit | under detectable limit |
| Ba | 0.03 | ③ | under detectable limit | under detectable limit | under detectable limit |
| Be | 0.02 | ③ | under detectable limit | under detectable limit | under detectable limit |
| Ca | 0.04 | ③ | under detectable limit | under detectable limit | under detectable limit |
| Cr | 0.07 | ① | under detectable limit | under detectable limit | under detectable limit |
| Cu | 0.08 | ③ | under detectable limit | under detectable limit | under detectable limit |
| Fe | 0.04 | ③ | 0.04 | 0.05 | under detectable limit |
| Mg | 0.02 | ③ | under detectable limit | under detectable limit | under detectable limit |
| Mg | 0.03 | ③ | under detectable limit | under detectable limit | under detectable limit |
| Mo | 0.2 | ③ | under detectable limit | under detectable limit | under detectable limit |
| Ni | 0.1 | ③ | under detectable limit | under detectable limit | under detectable limit |
| Sr | 0.03 | ⑨ | under detectable limit | under detectable limit | under detectable limit |
| Ti | 0.09 | ② | under detectable limit | under detectable limit | under detectable limit |
| V | 0.07 | ② | under detectable limit | under detectable limit | under detectable limit |
| Ash content | less than 5 |  | less than 5 | less than 5 | less than 5 |

What is claimed is:

1. A high-purity carbon fiber reinforced carbon composite formed by a process comprising the steps of:

a) purifying carbon fibers under a halogen gas to form purified carbon fibers;

b) forming a molded member by packing said purified carbon fibers with a matrix of a carbon material; and c) graphitizing said molded member; wherein said high-purity carbon fiber reinforced carbon composite has an ash content of at most 30 ppm, and satisfies either or both of the following conditions for impurities:

1) V is not more than 0.12 ppm by ICP-OES; and

2) Fe is not more than 0.10 ppm by ICP-OES.

2. The high-purity carbon fiber reinforced carbon composite of claim 1, wherein said purified carbon fibers have an ash content of at most 80 ppm.

3. The high-purity carbon fiber reinforced carbon composite of claim 1, wherein said high-purity carbon fiber reinforced carbon composite, after being subjected to graphitizing, is impregnated and covered with pyrolytic carbon.

4. The high-purity carbon fiber reinforced carbon composite of claim 1, having a bulk density, after said graphitizing, of 1.35 to 1.80 g/cm$^3$, and wherein said carbon fibers comprise fibers, woven textiles and yarns, and said carbon material of said matrix is formed of pitch.

5. The high-purity carbon fiber reinforced carbon composite of claim 1, having a bulk density after said graphitizing of 1.35 to 1.80 g/cm$^3$, and wherein said carbon fibers comprise fibers, woven textiles and yarns, and said carbon material of said matrix is formed of phenol resin.

6. The high-purity carbon fiber reinforced carbon composite of claim 1, having a bulk density after said graphitizing of 1.35 to 1.80 g/cm$^3$, and wherein said carbon fibers comprise fibers, woven textiles and yarns, and said carbon material of said matrix is formed of pyrolytic carbon.

7. The high-purity carbon fiber reinforced carbon composite of claim 1, having a fiber content of 45 to 60%.

8. The high-purity carbon fiber reinforced carbon composite of claim 1, having a bending strength of from 55 to 200 MPa.

9. The high-purity carbon fiber reinforced carbon composite of claim 1, having an electrical resistivity at room temperature of from 13 to 40 $\mu\Omega$m.

10. The high-purity carbon fiber reinforced carbon composite of claim 1, which used for a component of a pulling single crystal apparatus for the semiconductor industry.

11. A method of producing the high-purity carbon fiber reinforced carbon composite of claim 1, which comprises the steps of:

a) purifying carbon fibers under halogen gas, thereby removing impurities;

b) forming a molded member;

c) densifying said molded member by impregnating pitch or resin; and d) carbonizing said molded member.

12. The method of claim 11, wherein each of step c) and d) are repeated 2 to 4 times.

13. The method of claim 11, wherein each of step c) and d) are conducted before purification process with graphitization of the molded member under halogen gas, thereby removing impurities.

14. The method of claim 11, which further comprises, after step d) machining said molded member into a form.

15. The method of claim 14, which further comprises, after said machining, heat treating said form under a halogen gas atmosphere at reduced pressure, thereby removing impurities.

16. The high-purity carbon fiber reinforced carbon composite of claim 1, having:

i) a fiber content of 49–58% vol;

ii) a bulk density of 1.55–1.64 g/cm$^3$;

iii) a bending strength of 82.8–198 MPa; and iv) an electrical resistivity of 14–19.4 $\mu\Omega\cdot$m.

17. The high-purity carbon fiber reinforced carbon composite of claim 1, having an ash content of less than 5 ppm, and amounts of each of Al, B, Ba, Be, Ca, Cr, Cu, Mg, Mn, Mo, Ni, Sr, Ti and V, which are under the detectable limit for each.

18. The high-purity carbon fiber reinforced carbon composite of claim 16, having a content of Fe which is under the detectable limit.

19. The high-purity carbon fiber reinforced composite of claim 15, having a bending strength of 166 to 198 MPa.

20. The high-purity carbon fiber reinforced carbon reinforced carbon composite of claim 1, wherein said ash content impurity is at most 10 ppm.

* * * * *